United States Patent
Hiser et al.

(10) Patent No.: US 7,029,932 B1
(45) Date of Patent: Apr. 18, 2006

(54) CIRCUIT AND METHOD FOR MEASURING CONTACT RESISTANCE

(75) Inventors: Daryl T. Hiser, Tucson, AZ (US); Stephen J. Sanchez, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/052,121

(22) Filed: Feb. 7, 2005

(51) Int. Cl.
*H01L 21/66* (2006.01)

(52) U.S. Cl. .......................................... 438/14; 438/18

(58) Field of Classification Search ............ 438/14–18
See application file for complete search history.

(56) References Cited

U.S. PATENT DOCUMENTS 6,485,991 B1 * 11/2002 Jitramas et al. ............... 438/14

* cited by examiner

*Primary Examiner*—H. Jey Tsai

(74) *Attorney, Agent, or Firm*—W. Daniel Swayze, Jr.; W. James Brady; Frederick J. Telecky, Jr.

(57) ABSTRACT

Parametric testing of an integrated circuit chip includes pressing first, second, and third contact elements (PRB-1,2, 3) against first, second and third terminals (P1–3), respectively, of the integrated circuit and forcing first, second, and third reference currents (Iref) through first, second, and third circuit paths each including a corresponding ESD diode. Each path includes two of the contact elements, two associated contact resistances, and one of the ESD diodes. First, second, and third voltages (Vm1–3) are measured across the three circuit paths. Three equations representative of the three voltages are simultaneously solved to determine three contact resistances between the various contact elements and integrated circuit terminals. The voltages across the three contact resistances are computed by multiplying them by parametric test currents and are added to or subtracted from measured voltages of the contact elements to obtain accurate values of voltages of the integrated circuit terminals.

18 Claims, 5 Drawing Sheets

US 7,029,932 B1

CIRCUIT AND METHOD FOR MEASURING CONTACT RESISTANCE

BACKGROUND OF THE INVENTION

The present invention relates generally to circuitry and techniques for measuring contact resistance of leads or pins of packaged integrated circuits and bonding pads or test pads of un-packaged integrated circuits without using the expensive prior techniques such as use of Kelvin contacts which eliminate errors caused by contact resistances.

Parametric testing of packaged integrated circuit chips involves pressing tips of conductive "contactors" against package leads or pins of packaged integrated circuits. Parametric testing of un-packaged integrated circuit chips can be performed by pressing conductive probes against bonding pad metallization surfaces or test point metallization surfaces. In any case, there always is a parasitic "contact resistance" that occurs due to the making a contact between the contactor surface or the probe tip surface and the package pin or bonding pad surface. The value of the contact resistance usually is unknown and often results in degradation of test signals and reduces testing accuracy. The signal degradation may lead to a need for larger guard bands around the measured parameters. Increased guard bands usually result in lower chip yields, and hence results in higher integrated circuit chip costs.

A common source of measurement error in the testing of integrated circuits is the above mentioned contact resistance. Any package pin or integrated circuit bonding pad that sources or sinks current is subject to voltage drops or voltage increases across the associated contact resistance. It is difficult to control the contact resistance because it is caused by many variables. For example, normal wear on package pins or bonding pads and/or probe interface surfaces, contact surface irregularities, contamination, variations in probe contact surface planarity, and variation in the plunge force applied to the contact probe or contactor surface all can cause significant changes in the contact resistance. Regular probe interface surface maintenance and cleaning usually minimize the magnitude of the contact resistance, but do not necessarily reduce chip-to-chip variation in the values of contact resistance and/or pin-to-pin variation that occur during integrated circuit testing because there are too many causes of contact resistance variation that are not adequately addressed by ordinary maintenance and cleaning procedures.

Contact resistance errors usually limit the accuracy of conventional trimming operations in integrated circuits in which the values of components such as thin film resistors are precisely trimmed by conventional laser trimming techniques or other conventional trimming techniques. The contact resistance errors usually also limit the capabilities of parametric testing of integrated circuits. Contact resistance errors also necessitate the use of wider guard bands for measured parameters, looser integrated circuit product specifications, and lowering of otherwise achievable circuit performance objectives for the integrated circuits.

One known solution to the problem of contact resistance errors is to use Kelvin contacts during parametric testing of packaged or un-packaged integrated circuits. A Kelvin contact utilizes two probe contacts to the bonding pad, in such a manner as to provide a zero-current path to the pad through one probe contact for the purpose of precisely sensing the voltage on the pad and a standard current path through the other probe contact. This technique facilitates accurate measurement of a voltage of each integrated circuit terminal at which a Kelvin contact is provided under all but extreme contact resistance conditions. Unfortunately, Kelvin contacts are expensive because of the two required probes and the required expensive sensing and driving circuitry. Consequently, use of Kelvin contacts is not available or practical for many integrated circuit package options. This means that many integrated circuits must be tested without the accuracy achievable by use of Kelvin contacts and therefore suffer contact resistance errors that reduce both manufacturing yield and integrated circuit performance.

FIG. 1 illustrates a standard single contact per pin arrangement. The Device under Test (DUT) is a packaged integrated circuit which includes three package leads or pins PN1, PN2, and PN3. Pin PN3 is contacted by a "contactor" C3 which is connected to conductors 3 and 4. Contactors are resilient, spring-biased or cantilevered conductive contact surfaces supported in a contact assembly included in a parametric tester/contactor machine such as parametric tester/contactor machine 18A in subsequently described FIG. 3A, and a conventional integrated circuit package handler grips the integrated circuit package 1A and "plunges" its pins PN1,2 . . . etc. against the contactors PRB-1,2 . . . etc. Conductor 3 is connected to the sense output of a force/sense power supply unit 2 which produces a positive supply voltage VCC on pin PN3 relative to a ground voltage on ground conductor 5. Contactor 3 is pressed against pin PN3, resulting in a contact resistance R3 between contactor C3 and pin PN3. Similarly, pin PN2 is contacted by a ground contactor C2 connected to ground conductor 5, producing a contact resistance R2 between ground contactor C2 and pin PN2. Output pin PN1 is contacted by a contactor C1 that is connected to conductor 6 and pressed against pin PN1, producing a contact resistance R1 between it and contactor C1. A load resistor RL is connected between conductor 6 and ground conductor 5. A quiescent current IQ flows through pin PN2 and contact resistance R2 into ground conductor 5. A load current IL flows through pin PN1, contact resistance R1, and load resistance RL. A total current IT flows through contactor C3, contact resistance R3, and pin PN3. High impedance voltmeter 7 has its (+) input connected to conductor 6 and its (−) input connected to ground conductor 5.

The voltage drops across contact resistances R2 and R1 in FIG. 1 affect the parametric measurements, since the actual voltage measurement between conductor 6 and ground conductor 5 is now equal to Vout+((IQ*R2)−(IL*R1)), where IQ is the quiescent current, and IL is the load current. However, the desired measurement is an accurate value of Vout, which is the potential of PN1 relative to the potential of PN2 of the DUT 1. The measurement of the voltage on conductor 6 is an erroneous representation of Vout because of the $I_L$-dependent voltage drop across contact resistance R1, and also because of the IQ-dependent voltage drop across contact resistance R2. This erroneous representation decreases in the accuracy of the measurement of Vout. Consequently, the performance specifications of the DUT may need to be lowered, and guard bands of various tested parameters of the DUT may need to be broadened, reducing the manufacturing yield of the DUT and increasing its cost.

As subsequently explained in more detail, parametric testing measurements using the above mentioned Kelvin contacts require a first circuit path that is a load path or current-conducting path and a second circuit path which is a zero-current path, where zero-current is defined here as being extremely low current (e.g., pico-amperes). A high impedance meter (or high impedance buffer) is utilized so that the actual package pin (or bonding pad) is located ahead of the contact resistance being measured.

FIG. 2 illustrates Kelvin contacts in a typical test application where high precision and high accuracy are required and contact resistance is not controllable. As in FIG. 1, a packaged integrated circuit DUT includes three pins PN1, PN2, and PN3. Pin PN3 is contacted by a conductive probe or "contactor" 3A and an associated conductor 3 which is connected to the very high impedance "sense" input of a power supply 2 that uses voltage feedback via conductor 3 to produce a precise positive supply voltage VCC on pin PN3 relative to a ground voltage on ground conductor 5. Contactor 3A is pressed against pin PN3, resulting in a contact resistance R31 between contactor 3A and pin PN3. Pin PN3 is also contacted by a contactor 3B and associated conductor 4 which is connected to the low impedance "force voltage" output of VCC power supply 2 to produce the precise value of VCC on pin PN3. Contactor 3B presses against pin PN3, resulting in a contact resistance R32 between contactor 3B and pin PN3. Similarly, pin PN2 is contacted by a ground contactor 8A connected to ground conductor 5, producing a contact resistance R21 between ground conductor 5 and pin PN2. Pin PN2 is also contacted by another ground contactor 8B connected to a conductor 5B which is connected to the (−) input of high impedance voltmeter 7, producing a contact resistance R22 between ground conductor 5B and pin PN2. Output pin PN1 is contacted by a contactor 6A electrically connected to conductor 6 is connected to the (+) of voltmeter 7. Contactor 6A is pressed against pin PN1, producing a contact resistance R11 between contactor 6A and pin PN1. A load resistor RL is connected between a contactor 6B and ground conductor 5A. Contactor 6B is pressed against pin PN1, producing a contact resistance R12 between contactor 6B and pin PN1.

A quiescent current IQ flows through pin PN2 and contact resistance R21 into ground conductor 5. A load current IL flows through pin PN1, contact resistance R12, and load resistance RL, and a total current IT flows from conductor 4 through contact resistance R32 into pin PN3. High impedance voltmeter 7 has its (+) input connected to conductor 6 and its (−) input connected to ground conductor 5B.

A Kelvin contact measurement is a zero-current technique for measuring the voltage across a device. The method for eliminating the effects of contact resistance using Kelvin contacts in the circuit of FIG. 2 allows measurement of the voltage between package pins PN2 and PN3 without contact resistance errors associated with currents flowing through each of the pins of DUT. Since the input impedance is of voltmeter 7 and of the sense input of power supply 2 are very high, essentially no current flows across contact resistances R22, R11 or R31. There is no voltage drop between pin PN2 and the (−) input of voltmeter 7, no voltage drop between package pin PN1 and the (+) input of voltmeter 7, and no voltage drop across contact resistance R31.

The main prior art technique for obtaining accurate measurements in sensitive to contact resistances of integrated circuit pins and the like requires use of the above-described Kelvin contacts, which are very expensive, and also require use of expensive circuitry for implementing Kelvin contacts.

Most integrated circuits are required to meet rigorous ESD (electrostatic discharge) qualification standards. To meet such standards, inter-pin ESD (electrostatic discharge) diodes are incorporated into most integrated circuits to protect transistors and other devices connected to the pins by the bypassing electrostatic discharge currents around sensitive integrated circuitry. Ordinarily, ESD diodes are provided for each pin of the integrated circuit. Additionally, ESD diodes are ordinarily used during the testing of integrated circuits for checking continuity, i.e., the existence of a continuous electrical path from the tester hardware to the integrated circuit under test. This assures continuity of contact to the test fixture and also ensures integrity of the various wire bonds. This procedure is usually performed prior to applying electrical power to the integrated circuits and prior to the beginning of the parametric testing operation or a trimming operation.

There is an unmet need for a system and method for reducing the effect of inaccuracies caused by contact resistances caused by external probes or contactor surfaces during parametric testing of packaged and/or un-packaged integrated circuits.

There is an unmet need for a system and method for reducing the effect of inaccuracies caused by contact resistances due to external probes or contactor surfaces during parametric testing of packaged and/or un-packaged integrated circuits and that is applicable independently of the integrated circuit package type.

There also is an unmet need for a way to avoid the high cost of using Kelvin contacts during parametric testing of packaged integrated circuits and/or un-packaged integrated circuit chips.

SUMMARY OF THE INVENTION

It is an object of the invention to provide a system and method for reducing the effect of inaccuracies due to contact resistances caused by external probes or contactors during parametric testing of packaged and/or un-packaged integrated circuits.

It is another object of the invention to provide a system and method for reducing the effect of inaccuracies due to contact resistances caused by external contactors during parametric testing of packaged integrated circuits, wherein the system and/or method are substantially independent of the integrated circuit package type.

It is another object of the invention to avoid the high cost of using Kelvin contacts during parametric testing of packaged integrated circuits and/or un-packaged integrated circuit chips.

Briefly described, and in accordance with one embodiment, the present invention provides a technique for parametric testing of an integrated circuit chip, including pressing first, second, and third contact elements (PRB-1,2,3) against first, second and third terminals (P1–3), respectively, of the integrated circuit and forcing first, second, and third reference currents (Iref) through first, second, and third circuit paths each including a corresponding ESD diode. Each path includes two of the contact elements, two associated contact resistances, and one of the ESD diodes. First, second, and third voltages (Vm1–3) are measured across the three circuit paths. Three equations representative of the three voltages are simultaneously solved to determine three contact resistances between the various contact elements and integrated circuit terminals. The voltages across the three contact resistances are computed by multiplying them by parametric test currents and are added to or subtracted from measured voltages of the contact elements to obtain accurate values of voltages of the integrated circuit terminals.

In the described embodiment, a method of testing an integrated circuit chip (1A or 1B) including a first terminal (P3), a second terminal (P2), and a third terminal (P1) includes providing first (D2), second (D1), and third (D3) ESD diodes on the integrated circuit chip (1A or 1B), anodes of the first (D2) and second (D1) ESD diodes being coupled to the second terminal (P2), cathodes of the first (D2) and third (D3) ESD diodes being coupled to the first terminal (P3), an anode of the third (D3) ESD diode and a cathode of the second (D1) ESD diode being coupled to the third terminal (P1), the first (D2), second (D1), and third (D3) ESD diodes having known first (Rd2), second (Rd1) and third (Rd3) forward resistances, respectively. First (PRB-3), second (PRB-2), and third (PRB-1) contact elements are pressed against the first (P3), second (P2) and third (P1) terminals, respectively. A first reference current (Iref) is forced through a first circuit path including the second contact element (PRB-2), the second ESD diode (D1), the third contact resistance (R1), and the third contact element (PRB-1) and a first voltage (Vm1) across the first circuit path is measured. A second reference current is forced through a second circuit path including the second contact element (PRB-2), the first ESD diode (D2), and the first contact element (PRB-3), and a second voltage (Vm2) across the second circuit path is measured, and a third reference current is forced through a third circuit path including the third contact element (PRB-1), the third ESD diode (D3), and the first contact element (PRB-3) and a third voltage (Vm3) across the third circuit path is measured. Three equations representative of the first (Vm1), second (Vm2), and third (Vm3) voltages are solved simultaneously to determine first (R3), second (R2), and third (R1) contact resistances between the first contact element (PRB-3) and the first terminal (P3), the second contact element (PRB-2) and the second terminal (P2), and the third contact element (PRB-1) and the third terminal (P1), respectively. A parametric test operation is performed on the integrated circuit chip (1A or 1B) to determine a parameter dependent on a voltage of the third terminal (P1) by determining a first test current through the third contact resistance (R1) and using the first test current to determine a voltage drop across the third contact resistance (R1), and computing a value equal to a measurement voltage of the third contact element (PRB-1) offset by the amount of the voltage drop across the third contact resistance (R1) to obtain a more accurate measurement value representative of the voltage of the third terminal (P1).

In the described embodiment, the first terminal (P3) is a first supply voltage terminal (P3), the second terminal (P2) is a second supply voltage terminal (P2), and the third terminal (P1) is a first signal terminal (P1). The first, second, and third reference currents can be differential or non-differential reference currents. The integrated circuit chip can be an un-packaged integrated circuit chip (1B), wherein each contact element is an external conductive probe of a probe machine (18B), and wherein each terminal is a bonding pad of the un-packaged integrated circuit chip. Alternatively, the integrated circuit chip can be a packaged integrated circuit chip (1A), wherein each contact element is a conductive external contactor of a contactor machine (18A), and wherein each terminal is a pin of the packaged integrated circuit chip.

In one embodiment of the invention, the integrated circuit chip (1A or 1B) includes a second signal terminal (P4), a fourth ESD diode (D5) having a cathode coupled to the first supply voltage terminal (P3) and an anode coupled to the second signal terminal (P4) and also includes a fifth ESD diode (D6) having a cathode coupled to the second signal terminal (P4) and an anode coupled to the second supply voltage terminal (P2). The method includes pressing a tip of a fourth contact element (PRB-4) against the second signal terminal (P1), causing a fourth contact resistance (R4) between the fourth contact element (PRB-4) and the second signal bonding pad (P4), forcing a fourth reference current through a fourth circuit path including the fourth contact element (PRB-4), the fourth contact resistance (R4), the second signal terminal (P4) and one of a first sub-path and a second sub-path, the first sub-path including the fourth ESD diode (D5), the first supply voltage terminal(P3), the first contact resistance (R3) and the first contact element (PRB-3), the second sub-path including the fifth ESD diode (D6), the second supply voltage terminal (P2), the second contact resistance (R2), and the second contact element (PRB-2), measuring a resulting voltage across the fourth circuit path. An equation representative of the resulting voltage across the fourth circuit path is solved to determine the fourth contact resistance (R4). A second test current through the fourth contact resistance (R4) is determined, and a value of a measurement voltage of the fourth contact element (PRB-4) offset by a resulting voltage drop across the fourth contact resistance (R1) is computed to obtain a more accurate measurement value representative of a voltage of the second signal terminal (P4).

In another embodiment of the invention, an integrated circuit chip including a first terminal (P3) and a second terminal (P1) is tested by providing an ESD diode (D3) on the integrated circuit chip, an anode of the ESD diode being coupled to the second terminal (P1) and a cathode of the ESD diode being coupled in series with the first terminal (P3), the ESD diode having a known forward resistance (Rd). First (PRB-3) and second (PRB-1) contact elements are pressed against the first (P3) and second (P1) terminals thereby producing first (R3) and second (R1) contact resistances to the the first (P3) and second (P1) terminals, respectively. A reference current is forced through a circuit path including the first contact element (PRB-3), the first contact resistance (R3), the ESD diode (D3), the second contact resistance (R1), and the second contact element (PRB-1), and a voltage across the circuit path is measured. A sum of the first (R3) and second (R1) contact resistances and the known forward resistance (Rd) of the ESD diode is computed, by dividing the measured voltage by the reference current, and a sum of the first (R3) and second (R1) contact resistances is computed by subtracting the known forward resistance (Rd) of the ESD diode from the computed sum of the first (R3) and second (R1) contact resistances and the known forward resistance (Rd) of the ESD diode. A parametric test operation is performed on the integrated circuit chip to determine a parameter dependent on a voltage difference between the first terminal (P3) and the second terminal (P1) by determining a test current through the a circuit path including the first contact resistance (R3) and the second contact resistance (R1), and subtracting a computed voltage equal to a product of the test current multiplied by the computed sum of the first (P3) and second (P1) contact resistances from a difference between a measurement voltage of the first contact element (PRB-3) and a measurement voltage of the second contact element (PRB-1).

DETAILED DESCRIPTION OF THE PREFERRED EMBODIMENTS

The present invention provides a way of using ESD diodes, which are ordinarily included in most integrated circuits to protect transistors connected via bonding pads to package pins, so as to provide accurate measurement of contact resistances using the contact resistance values to more accurately interpret test results from parametric testing of the integrated circuits. (The term "measurement" as used herein is intended to include a direct measurement of a current or voltage by using an appropriate meter or the like, and also include a value of a desired parameter obtained using a processor or computer or the like to compute the value based on such a direct measurement.)

Figure 3A:
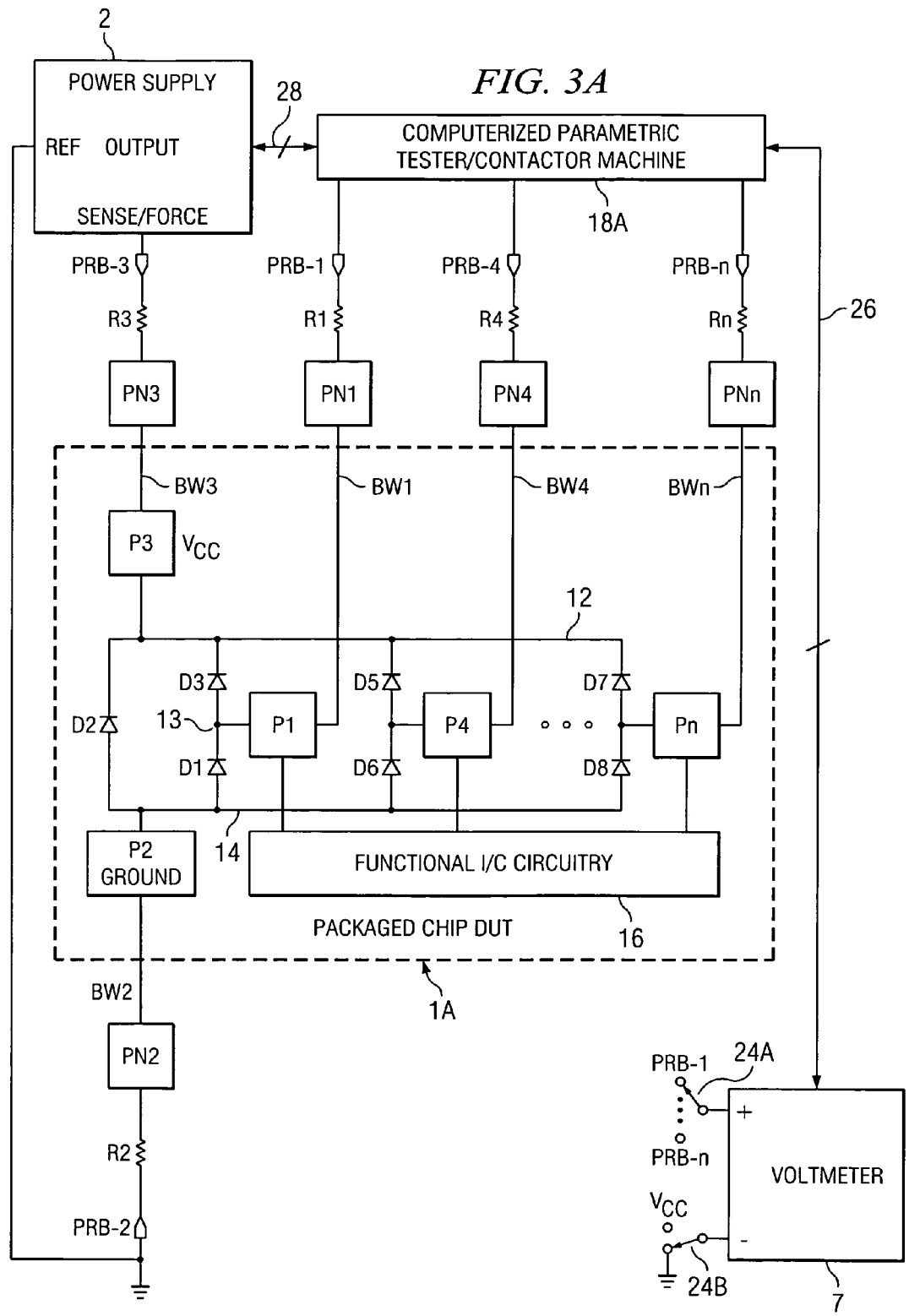
FIG. 3A is a block diagram of circuitry for measuring and minimizing the effects of contact resistance on parametric testing of a packaged integrated circuit in accordance with the present invention.

FIG. 3A shows a packaged integrated circuit 1A which includes internal product-specific functional circuitry 16, a internal VCC power supply bonding pad P3, an internal ground supply bonding pad P2, and a number of internal signal bonding pads including bonding pads P1 and P4, . . . Pn. Bonding pad P3 is connected by conductor 12 to the cathodes of ESD diodes D2, D3, D5 and D7 and to the product-specific functional circuitry 16. Bonding pad P2 is connected to the anodes of the ESD diodes D1, D2, D6 and D8 and to the product-specific functional circuitry 16. Bonding pad P1 is connected to the anode of ESD diode D3 and to the cathode of ESD diode D1, and is also connected to product-specific functional circuitry 16. Similarly, bonding pad P4 is connected to the anode of ESD diode D5 and to the cathode of ESD diode D6, and is also connected to product-specific functional circuitry 16. Bonding pad Pn is connected to the anode of ESD diode D7 and to the cathode of ESD diode D8, and is also connected to product-specific functional circuitry 16. Packaged integrated circuit 1A also includes external leads or pins PN-1, PN-2, . . . PN-n which are connected by bonding wires BW1,BW2, . . . BWn, respectively to internal bonding pads P1,P2, . . . Pn as shown.

Packaged integrated circuit 1A is coupled to a programmable, computerized parametric tester/contactor machine 18A, a VCC power supply 2, an external ground conductor 5, and a voltmeter 7 which all are used to accomplish parametric testing of packaged integrated circuit 1A and to accomplish accurate measurement of various contact resistances in accordance with the present invention. Specifically, conductive probes or "contactors" PRB-1, PRB-2, PRB-3, PRB-4, . . . PRB-n are pressed against corresponding package pins PN1, PN2, PN3, PN4 . . . PNn, respectively, during parametric testing and during the measurements of the various contact resistances (by moving the contactors against the pins, or vice versa). Contactors PRB-2 and PRB-3 are connected to ground conductor 5 and VCC power supply 2, respectively. Probes PRB-1 and PRB-4, . . . PRB-n are connected to parametric tester/contactor machine 18A.

The (+) input of voltmeter 7 is selectively coupled up by switch circuitry 24A to any of the various probes PRB-1 . . . PRB-n to accomplish the various voltage measurements required to determine the contact resistances according to the present invention, and also to perform conventional parametric testing all of packaged integrated circuit 1A. Similarly, the (−) input of voltmeter 7 is selectively coupled by switching circuitry 24B to VCC probe PRB-3 or ground probe PRB-2, in order to accomplish measurements in accordance with the present invention in such a way as to obtain accurate measurements of the various contact resistances, and thereby enable the various contact resistances to be utilized to account for inaccuracies caused by contact resistance error. Switch 24B is required to allow voltmeter 7 to measure the voltage between pins PN1 or PN3 and any other DUT pin. Parametric tester/contactor machine 18A is also programmable to operatively connect a current source in series with each bonding pad of packaged in integrated circuit 1A. Voltmeter 7 is functionally coupled to a computer included in parametric tester/contactor machine 18A by means of a digital bus 26 to conduct digital voltage measurement information and voltmeter control information between voltmeter 7 and the programmable computer (not shown) within computerized parametric tester/contactor machine 18A. Preferably, the function and structure of voltmeter 7 is included within computerized parametric tester/contactor machine 18A so that it can be programmed to measure the voltage of any of probes PRB-1 through PRB-n with reference to either VCC or ground. Typically, power supply 2 is also integral to computerized parametric tester/contactor or probe machine 18A or 18B and is controlled by and transmits information via bus 28 to the same computer or microcontroller of computerized parametric tester/contactor or probe machine 18A or 18B. Computerized parametric tester/contactor or probe machine 18A or 18B typically also includes conventional analog or digital pin circuits (not shown) which each have the ability to force a current through a corresponding package pin or chip bonding pad and measure a voltage thereof with respect to a reference point.

Figure 3B:
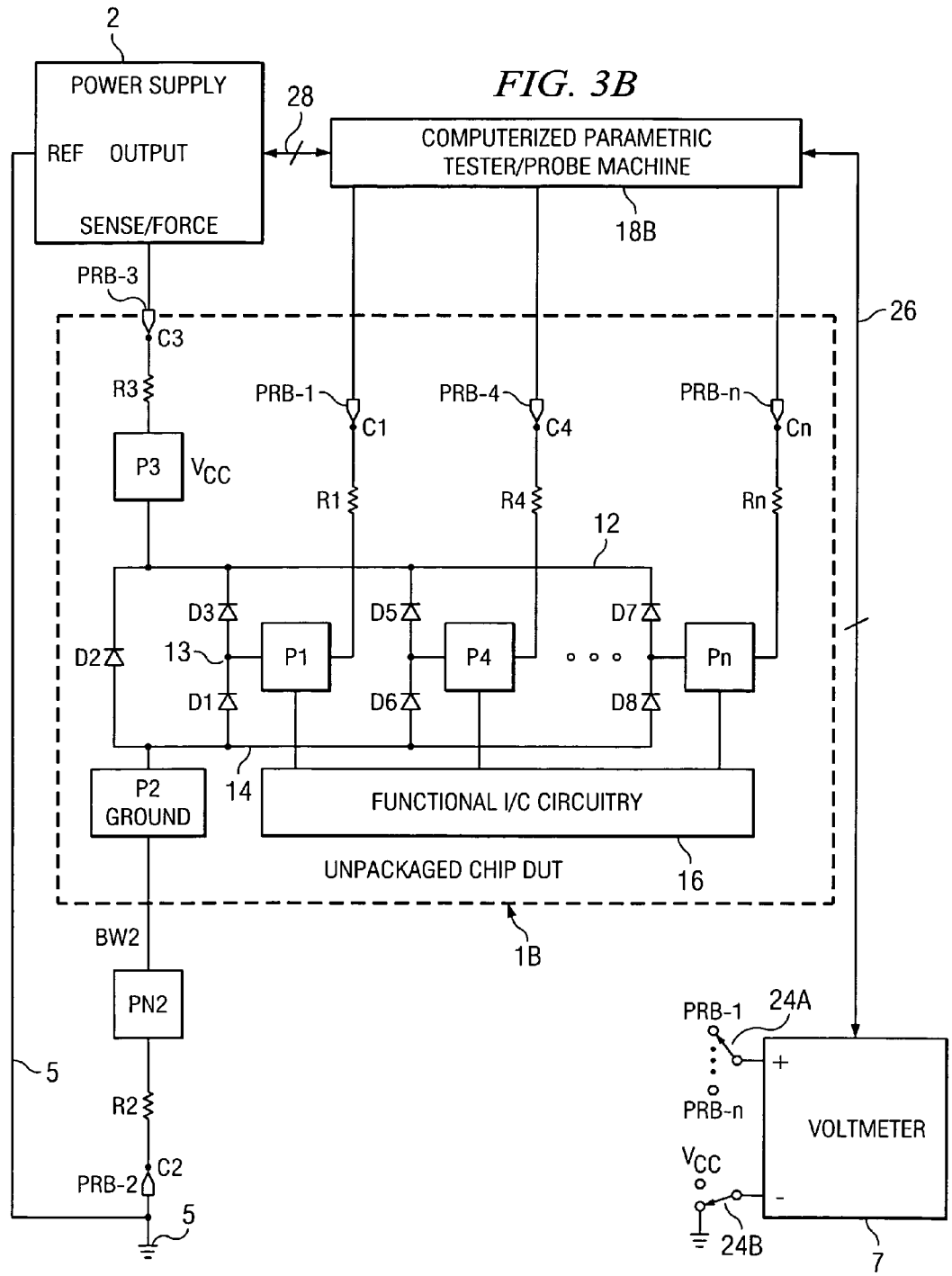
FIG. 3B is a block diagram of circuitry for measuring and minimizing the effects of contact resistance on parametric testing of an un-packaged integrated circuit in accordance with the present invention.

Similarly, FIG. 3B shows an un-packaged integrated circuit chip 1B which includes internal product-specific functional circuitry 16, a VCC power supply bonding pad P3, an internal ground supply bonding pad P2, and a number of internal signal bonding pads including bonding pads P1, P4 . . . Pn. Bonding pad P3 is connected by conductor 12 to the cathodes of ESD diodes D2, D3, D5 and D7 and to the product-specific functional circuitry 16. Bonding pad P2 is connected to the anodes of the ESD diodes D1, D2, D6 and D8 and to the product-specific functional circuitry 16. Bonding pad P1 is connected to the anode of ESD diode D3 and to the cathode of ESD diode D1, and is also connected to product-specific functional circuitry 16. Similarly, bonding pad P4 is connected to the anode of ESD diode D5 and to the cathode of ESD diode D6, and is also connected to product-specific functional circuitry 16. Bonding pad Pn is connected to the anode of ESD diode D7 and to the cathode of ESD diode D8, and is also connected to product-specific functional circuitry 16.

Un-packaged integrated circuit chip 1B is coupled to a programmable, computerized parametric tester/probe machine 18B, a VCC power supply 2, an external ground conductor 5, and a voltmeter 7 which are used to accomplish parametric testing of integrated circuit chip 1A and measurement of various contact resistances in accordance with the present invention. Specifically, a number of conductive probes PRB-1, PRB-2, PRB-3, PRB-4, . . . PRB-n are pressed against internal bonding pads P1, P2, P3, P4 . . . Pn, respectively (by moving the probes against the bonding pads, or vice versa). Probes PRB-2 and PRB-3 are connected to ground conductor 5 and power supply 2, respectively. As in FIG. 3A, probes PRB-1 and PRB-4, . . . PRB-n in FIG. 3B are connected to programmable, computerized parametric tester/probe machine 18B. The (+) input of voltmeter 7 is selectively coupled up by switch circuitry 24A to the various probes PRB-1 . . . PRB-n and the (−) input of voltmeter 7 is selectively coupled by switching circuitry 24B to VCC probe PRB-3 or ground probe PRB-2, in order to accomplish parametric testing in accordance with the present invention in such a way as to obtain accurate measurements of the various contact resistances, and thereby enable the various contact resistances to be utilized to reduce inaccuracies caused by contact resistance error. As in FIG. 3A, voltmeter 7 is functionally coupled to a computer included in parametric tester/probe machine 18B by means of digital bus 26 to conduct digital voltage measurement information and control information between voltmeter 7 and the programmable computer (not shown) within computerized parametric tester/contactor machine 18B. Preferably, the function and structure of voltmeter 7 is included within parametric tester/probe machine 18B so that it can be conveniently programmed to measure the voltage of any of probes PRB-1 through PRB-n with reference to either VCC or ground.

The circuitry and method of the present invention operate to reduce the effects of contact resistance errors on parametric measurement values by first determining the values of the contact resistances, and then using those values of contact resistance to compute more accurate values of the measured parameters.

Figure 4:
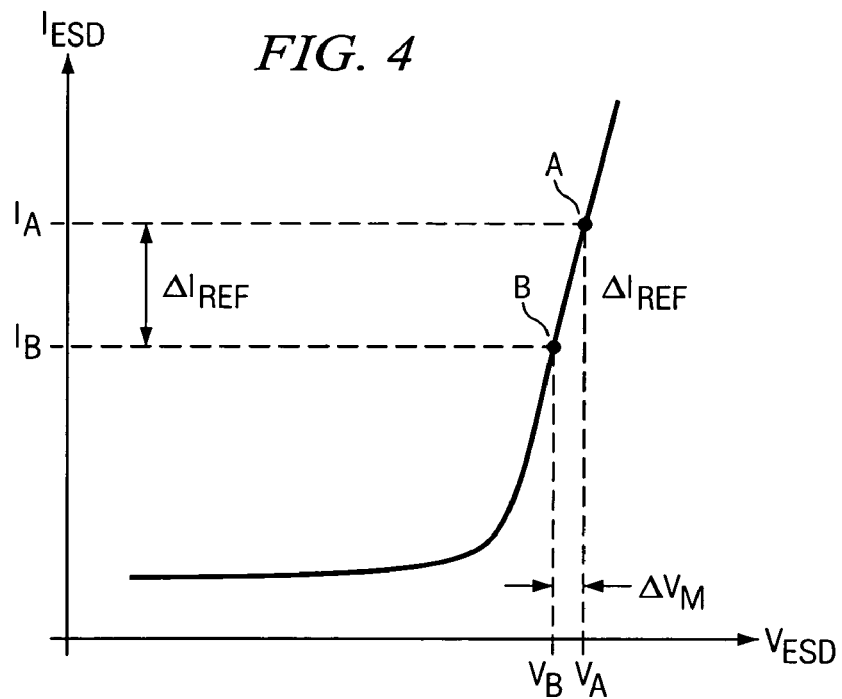
FIG. 4 is a graph of the current versus voltage characteristic of a typical forward biased ESD diode.

The voltage change across an ESD diode divided by the corresponding change in current through the ESD diode is equal to its characteristic resistance in a specified current window at a specified temperature, as illustrated in FIG. 4. The portion or window of the current versus voltage characteristic of a forward biased ESD diode between points A and B in FIG. 4 is fairly linear, and due to the normal large physical size of ESD diodes, the chip-to-chip variation in the above-mentioned window of the forward biased resistance characteristic of ESD diodes of the same physical structure is relatively small. The forward resistance of the ESD diode therefore is easily and accurately determined by forcing a current IA through the diode, measuring the resulting forward voltage VA, then forcing a current IB through the diode, measuring the resulting forward voltage VB, and then dividing (VA−VB) by (IA−IB).

In practice, the ESD diode is immersed in a temperature-controlled thermal bath of an inert liquid, the temperature of which is very precisely controlled. The ESD diode resistance is measured at suitable temperatures, e.g. 25 degrees C. and 90 degrees C. The currents IA and IB shown in the ESD diode characteristic in FIG. 4 are forced through the immersed ESD diode and the corresponding voltages VA and VB are measured, and the forward resistance Rd is measured as explained above. The ESD diode forward resistance values then are stored as constants in the parametric test program executed by computerized parametric tester/contactor machine 18A or computerized parametric tester/probe machine 18B. The part-to-part variation in the ESD diode forward resistances is negligible compared to the potential variation in the contact resistances.

Figure 5:
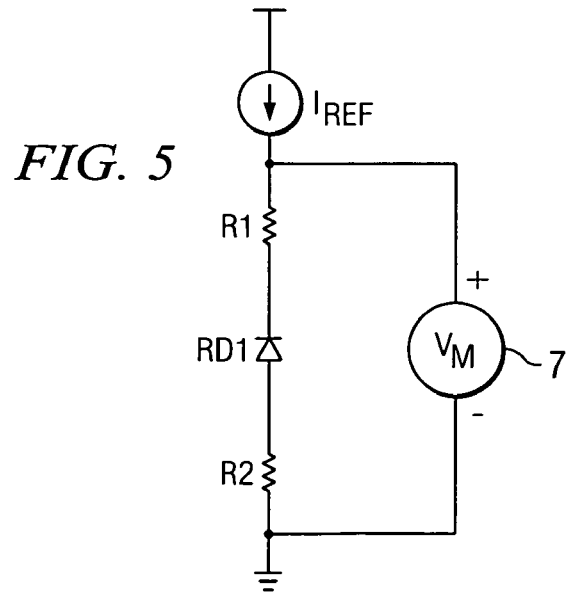
FIG. 5 is a diagram of an example of an equivalent circuit established when a parametric tester/probe machine makes contact with package pins PN1 and PN2 in FIG. 3A, including contact resistances R1 and R2 and ESD diode resistance Rd1.

FIG. 5 shows an example of an equivalent circuit established when a parametric tester/probe machine makes contact with package pins PN1 and PN2 in FIG. 3A or bonding pads P1 and P2 in FIG. 3B, including contact resistances R1 and R2 and ESD diode resistance Rd1, where the forward-biased resistance Rd1 of ESD diode has been previously determined as explained above with reference to FIG. 4. The value of current source Iref is set to the value IA and a resulting voltage Vm1 across the series connection of contact resistances R1 and R2 and the forward resistance Rd1 is measured by voltmeter 7. Then the value of current source Iref is set to the value IB, and a resulting voltage Vm2 across the series connection of contact resistances R1 and R2 and the forward resistance Rd1 is measured. A similar equivalent circuit is established whenever the parametric tester/probe machine makes contact with any other package pin (or bonding pad) and either the VCC package pin PN3 (or bonding pad P3) or the ground package pin PN2 (or bonding pad P2) in FIG. 3A or FIG. 3B. Computerized parametric tester/contactor machine 18A of FIG. 3A and computerized parametric tester/probe machine 18B of FIG. 3B each include conventional circuitry to provide a reference current Iref through each contactor or probe and measure a voltage Vm at each contactor or probe.

It should be appreciated that although the above described embodiments of the invention use VCC and ground power supplies for package pins and respectively, it is not essential that power supply pins be utilized in every embodiment of the invention. For example, in a hypothetical three terminal thin film resistor "Y"circuit, it is possible that ESD diodes could be provided to ensure that the resistors would not be damaged during an electrostatic discharge event. If one ESD diode were to be provided between every two pins for a total of 3 ESD diodes, the method of the present invention would work even without any particular power supply pins.

A basic equation that defines the particular equivalent circuit path shown in FIG. 5 is $$Vm = Iref(R1 + Rd1 + R2). \quad \text{Eq.(1)}$$

Referring again to FIGS. 3A and 3B, three equations describe the three different current paths through electrostatic discharge diodes D1, D2 and D3, contact resistances R1, R2 and R3, and package pins P1, P2 and P3. Those three equations are solved for the contact resistances R1, R2, R3 for the case when the same amount of current Iref is forced through each path and a corresponding contactor voltage or probe voltage Vm measured.

Once the contact resistances have been determined for package pins PN1, PN2 and PN3 (or bonding pads P1, P2 and P3), then the contact resistances for the additional package pins bonding pads can be determined much more simply, as subsequently explained. Then, the equation for the forced current path through the contact resistance associated with that bonding pad can be easily solved in terms of the measured voltage across it and a previously computed contact resistance. (The contact resistances must be determined at a particular temperature. However, they are a function of temperature, and will very from batch to batch and from chip to chip.)

By using and adapting the foregoing basic Equation (1) for the three above-mentioned circuit paths (R1-P1-D1-P2-R2, R1-P1-D3-P3-R3, and R2-P2-D2-P3-R3) shown in FIG. 3 and substituting for Iref, the following three equations are obtained:

$$Vm1 = Iref(R1 + Rd1 + R2), \quad \text{Eq.(2)}$$

$$Vm2 = Iref(R2 + Rd2 + R3), \text{ and} \quad \text{Eq.(3)}$$

$$Vm3 = Iref(R1 + Rd3 + R3), \quad \text{Eq.(4)}$$

where ESD diode forward resistances Rd1, Rd2, and Rd3 have previously measured constant values, as explained earlier.

Another basic equation, in differential form, that defines the circuit path shown in FIG. 5 is $$\Delta Vm = \Delta Iref(R1 + Rd1 + R2). \quad \text{Eq.(5)}$$

Referring again to FIGS. 3A and 3B, three basic difference equations also can describe the three different current paths through electrostatic discharge diodes D1, D2 and D3, contact resistances R1, R2 and R3, and package pins P1, P2 and P3. Those three difference equations are solved for the contact resistances R1, R2, R3 for the case when the same amount of incremental current $\Delta Iref = IA - IB$ is forced through each path and the corresponding contactor voltages or probe voltages VA and VB are measured, and the quantity $\Delta Vm$ is equal to VB−VA.

By using the foregoing basic Equation (5) for the three above-mentioned circuit paths (R1-P1-D1-P2-R2, R1-P1-D3-P3-R3, and R2-P2-D2-P3-R3) shown in FIG. 3 and substituting for $\Delta Iref$, the following three equations are obtained:

$$\Delta Vm1 = \Delta Iref(R1 + Rd1 + R2), \quad \text{Eq.(6)}$$

$$\Delta Vm2 = \Delta Iref(R2 + Rd2 + R3), \text{ and} \quad \text{Eq.(7)}$$

$$\Delta Vm3 = \Delta Iref(R1 + Rd3 + R3), \quad \text{Eq.(8)}$$

where ESD diode forward resistances Rd1, Rd2, and Rd3 have the previously determined constant values.

It should be noted that the accuracy achieved using difference Equations (6)–(8) may be significantly greater than the accuracy achieved using Equations (2)–(4) if there are errors common to IA and IB, because such errors are eliminated by the subtraction which produces $\Delta Iref$.

A parametric test program in computerized parametric tester/contactor machine 18A of FIG. 3A or parametric tester/probe machine 18B readily solves Equations (2)–(4) and/or Equations (6)–(8) to provide the values of each of contact resistances R1, R2 and R3. Various software programs for solving simultaneous linear equations are readily available to those skilled in the art.

Thus, the present invention provides a way of computing the contact resistances to ground and the power supply, so the current through any additional contactor or bonding pad and an associated electrostatic discharge diode can be easily determined by measuring the voltage on the associated contactor or probe and current through that contactor or probe and bonding pad to the ground supply or the power supply.

For integrated circuits with more than three pins (or bonding pads), such as the integrated circuits shown in FIGS. 3A and 3B, the contact resistance for each additional pin (or bonding pad) can be readily determined. For example, to determine contact resistance R4 in FIGS. 3A and 3B, the equation $\Delta Vm4 = \Delta Iref(R4 + Rd5 + R3)$, where both R3 and Rd5 are already known, can be used to compute the value of R4.

It should be understood that although the above described technique does not eliminate contact resistance error (as does the technique of using Kelvin contacts), but it greatly reduces the effect of contact resistance error and can result in much more accurate parametric testing of an integrated circuit, because knowing the values of the contact resistances means that the effects of contact resistance errors associated with them can be computed and combined with the measured probe or contactor voltages to provide more accurate values of the package pin voltages or chip bonding pad voltages.

The value of $\Delta Iref$ forced through any contactor or probe can be, for example, equal to (IA=20 milliamperes) minus (IB=10 milliamperes), i.e., equal to 10 milliamperes, and $\Delta Vm$ is the difference between the corresponding measured contactor voltages or probe voltages VA and VB.

The computerized parametric tester/contactor or probe machine 18A are 18B first performs the function of generating the input reference currents and measuring the package pin voltages or bonding pad voltages needed for the three equations to be solved for the three contact resistances R1, R2, and R3.

After those contact resistances are known, the computerized parametric tester/contactor or probe machine performs a suitable parametric test of an integrated circuit to be tested in accordance with a parametric test program written specifically for the integrated circuit to be tested, in order to determine which voltages and currents to apply to the various package pins or chip bonding pads of the integrated circuit and to also determine the terminals on which to measure the resulting output voltages and currents. The measured output voltages and currents then are compared by the parametric test program with stored specification values to determine if the integrated circuit is operating within determined specifications.

The parametric tester "knows" what the current through each contact resistance is when the voltage of the corresponding probe is being measured, and therefore can compute the resulting voltage drop across the contact resistance, and therefore can accurately compute the actual voltage on the integrated circuit package pin voltage or chip bonding pad voltage, by simply adding the voltage drop across the contact resistance to or subtracting it from the measured contactor or probe voltage. Generally, it is mathematically a very simple task to correct the measured probe voltages so as to obtain very precise values of the actual integrated circuit package pin voltages or bonding pad voltages. Stated differently, the parametric tester can easily compute all of the contactor voltage or probe voltage measurement errors due to the various contact resistances, and the parametric testing software can use the computed errors to correct the measured probe voltages so as to provide more accurate package pin voltage values or chip bonding pad voltage values.

Figure 1:
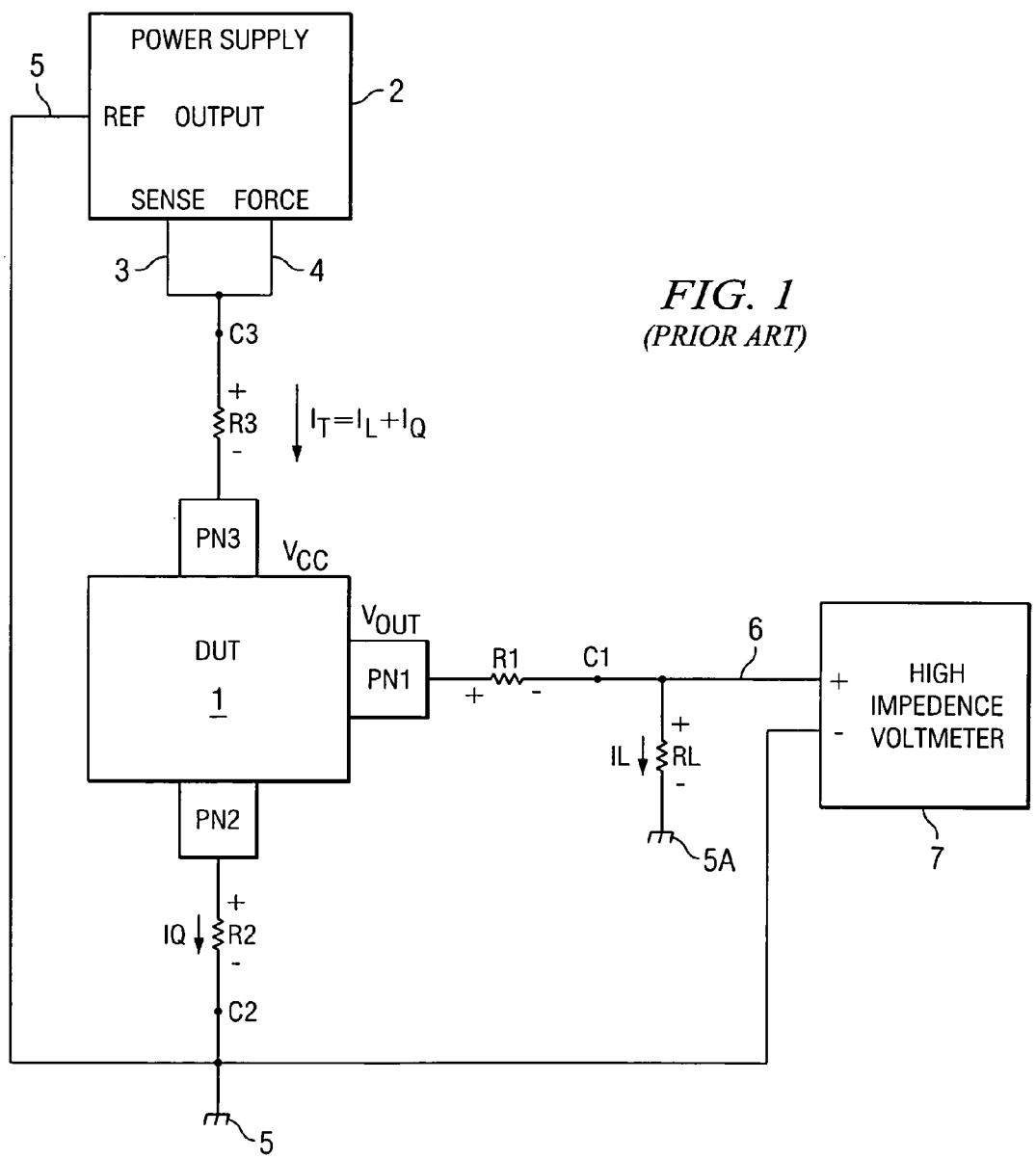
FIG. 1 is a block diagram of a prior art circuit useful in explaining the effects of contact resistance on parametric testing of an integrated circuit.
Figure 2:
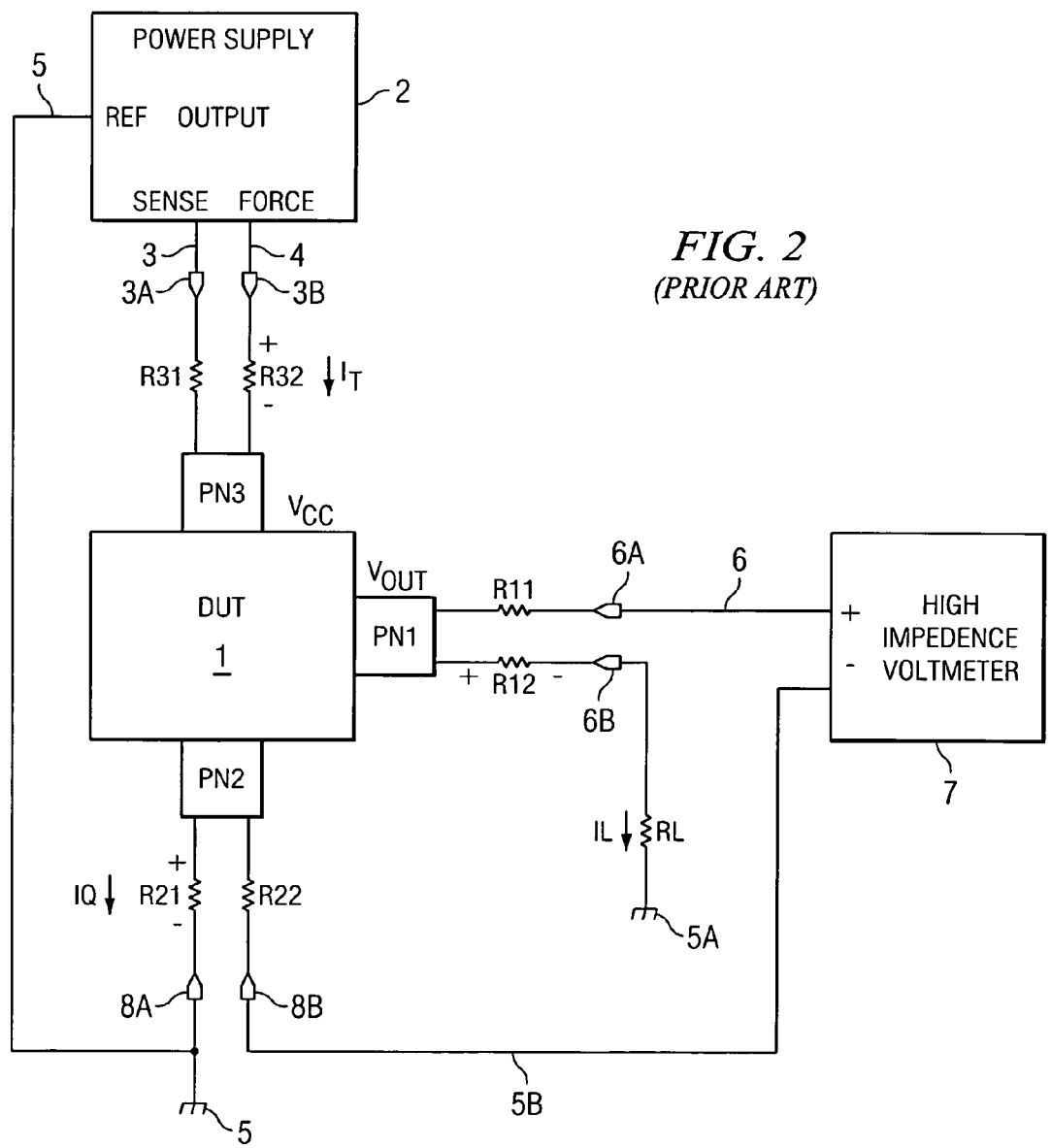
FIG. 2 is a block diagram of a prior art circuit useful in explaining the application of Kelvin contacts to high-precision, high accuracy parametric measurements.

Following is an example referring to FIG. 1 to specifically explain in effect of contact resistance and how the effect can be corrected or compensated by means of the present invention. Assume integrated circuit 1 in FIG. 1 is a typical a voltage regulator that is being parametrically tested using an arrangement similar to that shown in FIG. 3A. Also assume that a "load regulation" parameter is being tested, by varying the load resistance RL from a minimum value to a maximum guaranteed value. That might cause the load current to vary from as low as 0 up to, for example, 10 milliamperes. If the value of contact resistance R1 is 1 ohm and there are 10 milliamperes flowing through contact resistance R1, there will be a 10 millivolt drop across it. Therefore, Vout will be shifted by the 10 millivolts across contact resistance R1. That is, if Vout could be accurately measured, that measurement would not be shifted by the above mentioned 10 millivolt drop across contact resistance R1 due to the testing process. But since voltmeter 7 can only read the voltage on conductor 6, it cannot accurately read the value of Vout, and it is quite load-dependent because of the presence of contact resistance R1. Furthermore, that variation typically differs significantly from one integrated circuit chip to the next, because the value of contact resistance R1 actually could vary from as little as roughly 1 ohm to more than 20 ohms.

Consequently, the parametric measurement testing procedure makes it necessary to downgrade or widen the test guard bands for the specification of the above mentioned load regulation parameter from a more true but not measurable value to a less desirable but safer value.

In fact, the foregoing problem is even more complicated than described above, because the current through the contact resistance R1 actually is being provided by VCC power supply 2, so there is another voltage drop across contact resistance R3 which causes the voltage of pin PN3 to be inaccurate by the amount of the voltage drop across R3. This causes the actual value of Vout on pin PN1 to be erroneously shifted further by the amount of voltage drop of pin PN3. The present invention allows the actual value of Vout to be indirectly computed.

It should be appreciated that in some cases it is sufficient to know the sum of two contact resistances but is not necessary to know the value of each individual contact resistance. For example, if the voltage regulator referred to in the foregoing example is being tested to determine how close Vout can be driven to VCC or ground to guarantee that Vout can be driven to within 10 millivolts of VCC or 10 millivolts from ground with a particular load, then it is not necessary to determine the actual value of either of contact resistance R3 or R1, although it is necessary to determine the sum of their resistances. The voltage on the power supply sense conductor 3 and the voltage on conductor 6 can be directly measured. Therefore, if the sum of contact resistances R3+R1 is known, then the sum of the voltage drops across contact resistances R3 and R1 can be easily computed and subtracted from the voltage measured between conductor 6 and the "sense" conductor 3 of power supply 2. (The small error due to the known quiescent current IQ also can be determined if desired.)

Specifically, the potential difference between VCC on pin PN3 and Vout on PN1 is readily determined if the sum of the contact resistances R3+R1 is known, because in that case, the forward resistance Rd of one ESD diode (e.g., ESD diode D3 in FIG. 3A) coupled between pins PN1 and PN3 is also known because it has been previously determined. Therefore, forcing a known reference current through the circuit path including the unknown contact resistances R3 and R1 and the known ESD diode forward resistance determines the sum R1+R3+Rd, so subtracting the ESD diode resistance Rd from that sum provides the sum of contact resistances R1 and R3 even though it does not determine the resistance of either one individually. Thus, the voltage drop across these resistances during parametric testing can be determined by forcing a known current through them, and that voltage drop can be subtracted from the measured voltage between conductor 3 and conductor 6 to compute the true value of Vout. This assumes the measured voltage Vm=(Vp3−Vp1)+Iout(R1+R3)+Iq*R3, where Iq*R3 is a negligible error to Vm. If this error is significant to Vm, the previous embodiment solves this by finding the individual contact resistances.

The method of the present invention allows accurate computation of the various contact resistances in order to eliminate or adequately minimize the effects of measurement errors that would be associated with contact resistance if standard single contacts of prior art FIG. 1 were to be used.

In addition to eliminating errors caused by contact resistance, the method described in the disclosure eliminates the effect all of series trace resistance as well. It should be understood that of these resistances can be lumped together in the model of FIGS. 3A and 3B.

The invention provides the advantage of allowing the reduction of guard bands associated with parametric test limits, makes errors in parametric testing less sensitive to variations in bonding pad contact resistance, and results in higher chip manufacturing yield and therefore lower chip cost The invention also eliminates the need for using expensive Kelvin contacts, ground driver circuits, force/sense probes, and various other circuit techniques that have previously been employed to eliminate effects of contact resistance errors in parametric integrated circuit testing.

The invention also provides the advantage of being applicable to testing of integrated circuits independently of the package type, unlike the more restrictive use of Kelvin contacts which is available for only a subset of the integrated circuit package types.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A method of testing an integrated circuit chip including a first terminal, a second terminal, and a third terminal, the method comprising:
   (a) providing first, second, and third ESD diodes on the integrated circuit chip, anodes of the first and second ESD diodes being coupled to the second terminal, cathodes of the first and third ESD diodes being coupled to the first terminal, an anode of the third ESD diode and a cathode of the second ESD diode being coupled to the third terminal, the first, second, and third ESD diodes having known first, second and third forward resistances, respectively;
   (b) pressing first, second, and third contact elements against the first, second and third terminals, respectively;
   (c) forcing a first reference current through a first circuit path including the second contact element, the second ESD diode, the third contact resistance, and the third contact element and measuring a first voltage across the first circuit path,
   forcing a second reference current through a second circuit path including the second contact element, the first ESD diode, and the first contact element and measuring a second voltage across the second circuit path, and
   forcing a third reference current through a third circuit path including the third contact element, the third ESD diode, and the first contact element and measuring a third voltage across the third circuit path;
   (d) solving three equations representative of the first, second, and third voltages to determine first, second, and third contact resistances between the first contact element and the first terminal, the second contact element and the second terminal, and the third contact element and the third terminal, respectively; and (e) performing a parametric test operation on the integrated circuit chip to determine a parameter dependent on a voltage of the third terminal by determining a first test current through the third contact resistance and using the first test current to determine a voltage drop across the third contact resistance, and computing a value equal to a measurement voltage of the third contact element offset by the amount of the voltage drop across the third contact resistance to obtain a more accurate measurement value representative of the voltage of the third terminal.

2. The method of claim 1 wherein the first terminal is a first supply voltage terminal, the second terminal is a second supply voltage terminal, and the third terminal is a first signal terminal.

3. The method of claim 2 wherein the first, second, and third reference currents are differential reference currents.

4. The method of claim 2 wherein the integrated circuit chip is an un-packaged integrated circuit chip, and wherein each contact element is an external conductive probe of a probe machine, and wherein each terminal is a bonding pad of the un-packaged integrated circuit chip.

5. The method of claim 2 wherein the integrated circuit chip is a packaged integrated circuit chip, and wherein each contact element is a conductive external contactor of a contactor machine, and wherein each terminal is a pin of the packaged integrated circuit chip.

6. The method of claim 1 wherein step (e) includes determining a second test current through the second contact resistance and using the second test current to determine a voltage drop across the second contact resistance, and computing a value of a measurement voltage of the second contact element offset by the amount of the voltage drop across the second contact resistance to obtain a more accurate measurement value representative of the voltage of the second supply voltage terminal.

7. The method of claim 2 wherein the integrated circuit chip includes a second signal terminal, a fourth ESD diode having a cathode coupled to the first supply voltage terminal and an anode coupled to the second signal terminal and also includes a fifth ESD diode having a cathode coupled to the second signal terminal and an anode coupled to the second supply voltage terminal, the method including pressing a tip of a fourth contact element against the second signal terminal, causing a fourth contact resistance between the fourth contact element and the second signal bonding pad;

forcing a fourth reference current through a fourth circuit path including the fourth contact element, the fourth contact resistance, the second signal terminal and one of a first sub-path and a second sub-path, the first sub-path including the fourth ESD diode, the first supply voltage terminal, the first contact resistance and the first contact element, the second sub-path including the fifth ESD diode, the second supply voltage terminal, the second contact resistance, and the second contact element, and measuring a resulting voltage across the fourth circuit path;

solving an equation representative of the resulting voltage across the fourth circuit path to determine the fourth contact resistance; and determining a second test current through the fourth contact resistance, and computing a value of a measurement voltage of the fourth contact element offset by a resulting voltage drop across the fourth contact resistance to obtain a more accurate measurement value representative of a voltage of the second signal terminal.

8. The method of claim 2 wherein the first, second, and third reference currents are equal.

9. The method of claim 2 wherein step (b) includes operating a computerized parametric tester and contacting machine to press the first, second, and third contact elements against the first, second and third terminals, respectively.

10. The method of claim 1 wherein step (d) includes operating the computerized parametric tester and contacting machine to force the first, second, and third reference currents, measure the first, second, and third voltages, and solve the three equations.

11. The method of claim 10 including operating the computerized parametric tester and contacting machine to solve the equations $$Vm1 = Iref(R1 + Rd1 + R2),$$

$$Vm2 = Iref(R2 + Rd2 + R3), \text{ and}$$

$$Vm3 = Iref(R1 + Rd3 + R3),$$

wherein Iref is the value of the first, second, and third reference currents, Vm1, Vm2, and Vm3 are the values of the first, second, and third voltages, respectively, R1, R2, and R3 are the values of the first, second, and third contact resistances, respectively, and Rd1, Rd2, and Rd3 are values of the first, second, and third forward resistances, respectively.

12. The method of claim 11 including operating the computerized parametric tester and contacting machine to solve the equations $$\Delta Vm1 = \Delta Iref(R1 + Rd1 + R2),$$

$$\Delta Vm2 = \Delta Iref(R2 + Rd2 + R3), \text{ and}$$

$$\Delta Vm3 = \Delta Iref(R1 + Rd3 + R3),$$

wherein the first, second, and third reference currents are difference currents and the first, second, and third voltages are difference voltages, and wherein $\Delta$Iref is the value of the first, second, and third reference currents, $\Delta$Vm1, $\Delta$Vm2, and $\Delta$Vm3 are the values of the first, second, and third voltages, respectively, R1, R2, and R3 are the values of the first, second, and third contact resistances, respectively, and Rd1, Rd2, and Rd3 are the first, second, and third forward resistances, respectively.

13. The method of claim 2 including initially determining values of the forward resistances of the first, second, and third ESD diodes at values of the ESD diode forward current approximately equal to the values of the first, second, and third reference currents, respectively.

14. A method of testing an integrated circuit chip including a first terminal and a second terminal, the method comprising:

(a) providing an ESD diode on the integrated circuit chip, an anode of the ESD diode being coupled to the second terminal and a cathode of the ESD diode being coupled in series with the first terminal, the ESD diode having a known forward resistance;

(b) pressing first and second contact elements against the first and second terminals thereby producing first and second contact resistances to the the first and second terminals, respectively;

(c) forcing a reference current through a circuit path including the first contact element, the first contact resistance, the ESD diode, the second contact resistance, and the second contact element, and measuring a voltage across the circuit path;

(d) computing a sum of the first and second contact resistances and the known forward resistance of the ESD diode, by dividing the measured voltage by the reference current, and computing a sum of the first and second contact resistances by subtracting the known forward resistance of the ESD diode from the computed sum of the first and second contact resistances and the known forward resistance of the ESD diode; and (e) performing a parametric test operation on the integrated circuit chip to determine a parameter dependent on a voltage difference between the first terminal and the second terminal by determining a test current through the a circuit path including the first contact resistance and the second contact resistance, and subtracting a computed voltage equal to a product of the test current multiplied by the computed sum of the first and second contact resistances from a difference between a measurement voltage of the first contact element and a measurement voltage of the second contact element.

15. A system for testing an integrated circuit chip including a first terminal, a second terminal, and a third terminal, the system comprising:

(a) first, second, and third ESD diodes on the integrated circuit chip, anodes of the first and second ESD diodes being coupled to the second terminal, cathodes of the first and second ESD diodes being coupled to the first terminal, an anode of the third ESD diode and a cathode of the second ESD diode being coupled to the third terminal, the first, second, and third ESD diodes having known first, second and third forward resistances, respectively;

(b) means for pressing first, second, and third contact elements against the first, second and third terminals, respectively;

(c) means for forcing a first reference current through a first circuit path including the second contact element, the second ESD diode, the third contact resistance, and the third contact element and measuring a first voltage across the first circuit path, means for forcing a second reference current through a second circuit path including the second contact element, the first ESD diode, and the first contact element and measuring a second voltage across the second circuit path, and means for forcing a third reference current through a third circuit path including the third contact element, the third ESD diode, and the first contact element and measuring a third voltage across the third circuit path;

(d) means for solving three equations representative of the first, second, and third voltages to determine first, second, and third contact resistances between the first contact element and the first terminal, the second contact element and the second terminal, and the third contact element and the third terminal, respectively; and (e) means for performing a parametric test operation on the integrated circuit chip to determine a parameter dependent on a voltage of the third terminal by determining a first test current through the third contact resistance and using the first test current to determine a voltage drop across the third contact resistance, and computing a value equal to a measurement voltage of the third contact element offset by the amount of the voltage drop across the third contact resistance to obtain a more accurate measurement value representative of the voltage of the third terminal.

16. The system of claim 15 wherein the integrated circuit chip includes a second signal terminal, a fourth ESD diode having a cathode coupled to the first supply voltage terminal and an anode coupled to the second signal terminal and also includes a fifth ESD diode having a cathode coupled to the second signal terminal and an anode coupled to the second supply voltage terminal, the system including means for pressing a tip of a fourth contact element against the second signal terminal, causing a fourth contact resistance to appear between the fourth contact element and the second signal bonding pad;

means for forcing a reference current through a fourth circuit path including the fourth contact element, the fourth contact resistance, the second signal terminal and one of a first sub-path and a second sub-path, the first sub-path including the fourth ESD diode, the first supply voltage terminal, the first contact resistance and the first contact element, the second sub-path including the fifth ESD diode, the second supply voltage terminal, the second contact resistance, and the second contact element and measuring a resulting voltage across the fourth circuit path;

means for solving an equation representative of the resulting voltage to determine the fourth contact resistance; and means for determining a second test current through the fourth contact resistance, and computing a value of a measurement voltage on the fourth contact element offset by a resulting voltage drop across the fourth contact resistance to obtain a more accurate measurement value representative of a voltage on the second signal terminal.

17. A system for testing an integrated circuit chip including a first terminal and a second terminal, the system comprising:

(a) an ESD diode on the integrated circuit chip, an anode of the ESD diode being coupled to the second terminal and a cathode of the ESD diode being coupled in series with the first terminal, the ESD diode having a known forward resistance;

(b) means for pressing first and second contact elements against the first and second terminals thereby producing first and second contact resistances to the the first and second terminals, respectively;

(c) means for forcing a reference current through a circuit path including the first contact element, the first contact resistance, the ESD diode, the second contact resistance, and the second contact element, and measuring a voltage across the circuit path;

(d) means for computing a sum of the first and second contact resistances and the known forward resistance of the ESD diode, by dividing the measured voltage by the reference current, and computing a sum of the first and second contact resistances by subtracting the known forward resistance of the ESD diode from the computed sum of the first and second contact resistances and the known forward resistance of the ESD diode; and (e) means for performing a parametric test operation on the integrated circuit chip to determine a parameter dependent on a voltage difference between the first terminal and the second terminal by determining a test current through the a circuit path including the first contact resistance and the second contact resistance, and subtracting a computed voltage equal to a product of the test current multiplied by the computed sum of the first and second contact resistances from a difference between a measurement voltage of the first contact element and a measurement voltage of the second contact element.

18. The system of claim 17 wherein the integrated circuit chip is a voltage regulator.

* * * * *